United States Patent [19]

Bierig et al.

[11] 3,902,095

[45] Aug. 26, 1975

[54] ELECTRON BEAM SEMICONDUCTOR AMPLIFIER WITH SHIELDED DIODE JUNCTIONS

[75] Inventors: Robert W. Bierig, Sudbury; Robert L. Mozzi, Lincoln, both of Mass.

[73] Assignee: Raytheon Company, Lexington, Mass.

[22] Filed: Oct. 9, 1973

[21] Appl. No.: 404,521

[52] U.S. Cl. .................................... 313/367; 29/580
[51] Int. Cl.$^2$ ........................................... H01J 31/00
[58] Field of Search ............... 313/366, 367; 357/31

[56] References Cited

UNITED STATES PATENTS 3,697,831 10/1972 Anderson ............................ 317/235
3,707,657 12/1972 Veith ........................... 317/235 NA

*Primary Examiner*—R. V. Rolinec
*Assistant Examiner*—Lawrence J. Dahl
*Attorney, Agent, or Firm*—John R. Inge; Joseph D. Pannone; Milton D. Bartlett

[57] ABSTRACT

An improved electron bombardment semiconductor diode and amplifying tube employing shielding of the diode junction. A metallic shield is provided around the areas of the semiconductor diode junction exposed to the incoming electron beam. Incoming electrons are thereby prevented from striking the periphery and depletion region of the diode and hence surface and bulk charging effects are eliminated. The maximum reverse bias voltage is hence increased thereby increasing the maximum possible power output from tubes employing such diodes. An arrangement is disclosed for interconnection of a plurality of such diodes such that the capacitance between electrodes is substantially reduced and the frequency response of the device is correspondingly increased.

17 Claims, 10 Drawing Figures

ELECTRON BEAM SEMICONDUCTOR AMPLIFIER WITH SHIELDED DIODE JUNCTIONS

BACKGROUND OF THE INVENTION

The invention relates to electron beam semiconductor amplifier diodes and electron beam semiconductor tubes employing such diodes. Such tubes may be used as transmitter amplifiers, switching tubes, or as drivers for other high power amplifying tubes such as traveling wave tubes. In electron beam semiconductor tubes, an electron beam is directed under a high electric field towards a semiconductor diode. The electron beam current is modulated in accordance with the desired signal. When the electron beam strikes the semiconductor material, each electron in the beam will generate a large number of hole-electron pairs in the diode, typically 2000 pairs, for each electron in the electron beam. Such tubes are useful in that they have typically low input and output impedances and are capable of broadband response over a large range of frequencies.

Although the basic physical mechanisms of such tubes have been well understood for many years, such tubes have not heretobefore met with large scale commercial success because of a number of practical problems in the fabrication and operation of the diodes within the tubes. Of prime importance among these problems was the problem of excess surface charge accumulation on the surface of the diode struck by the electron beam and bulk charge accumulation in the depletion region of the diode. These two charge accumulations made the tubes less useful in that only relatively low reverse bias voltages could be applied without the diodes going into reverse breakdown. Typically, voltages of only 200 to 300 volts DC could be sustained before reverse breakdown. These charge accumulations also changed other electrical properties of the diode such as the frequency response since the properties of the diode with the charge accumulations present were no longer determined solely by the bulk characteristics of the semiconductor material. Moreover, diodes of the prior art used in electron beam semiconductor tubes were typically fabricated using planar techniques. Such techniques contributed to the high fringing fields present along the edges of the diode device when the reverse bias voltage is applied and hence contributed to the reverse breakdown characteristics of the diodes. Furthermore, the frequency response of electron beam semiconductor tubes using planar fabricated diodes was severely limited by the internal capacitance of the diode.

SUMMARY OF THE INVENTION

Hence, it is an object of the present invention to provide an electron beam semiconductor amplifier diode with substantially reduced surface and bulk charge accumulations. It is also an object of the present invention to provide such a diode with high reverse breakdown voltage. It is further an object of the present invention to provide an electron beam semiconductor tube wherein the characteristics of the diode contained therein are determined primarily by the bulk characteristics of the diode material. It is moreover an object of the present invention to provide an electron beam semiconductor tube with improved frequency response characteristics.

These, as well as other objects of the present invention, may be met by providing an electron beam wherein the electron beam is only permitted to strike desired areas of a semiconductor body. Such a means may be a conducting shield, contiguous to and thereby in contact with the semiconductor body, around the diode exposed area so as to prevent electrons from striking areas of the diode. Such a shield may, in some embodiments, be an integral part of the diode structure and may be fabricated during the process of making the diode itself. A thin conductor is placed over the exposed surface of the diode to drain excess surface charge from the diode. The periphery of the diode is then etched in a mesa structure thereby reducing the fringing field effects. The shield is preferably metal and has an aperture above a portion of the diode junction.

In particular, diodes in accordance with the present invention may be constructed by providing a layer of semiconductor material of a first conductivity type, a contiguous layer of semiconductor material of a second conductivity type, a junction being formed between the two layers of semiconductor material, an apertured layer of dielectric material contiguous to the second layer, and a region of conductive material continguous to both the second layer of semiconductor material and to the dielectric. The region of conductive material in the preferred embodiment comprises a layer of metal contiguous to the second layer of semiconductor material and another layer of metal having an aperture therein. A highly conductive layer joins the other two metal layers and provides a path for collected secondary electrons and surface charge. A heat sink may then be joined to remove excess heat from the device.

Diodes in accordance with the teachings of the present invention may be constructed by diffusing a layer of a second conductivity type into a wafer of a first conductivity type. The outside surfaces of the wafer are then oxidized and the wafer is thinned from the side opposite the diffused layer. The remaining oxide layer is etched away leaving an apertured region. A thin layer of aluminum is then deposited inside the aperture and partially on the oxide. A highly conductive layer is deposited over portions of the first diffused layer making contact with the aluminum layer. For shielding, an apertured shielding layer is plated over the highly conductive layer.

A number of those diodes may then be connected in series to provide a low capacitance composite diode with a large junction area. The conductivity types of similarly placed layers is alternated between adjacent diodes in the series connection in the preferred embodiment. A plurality of such diodes may be constructed at one time from a single wafer and the shielding material can be deposited thereon during the fabrication process.

As so fabricated such diodes are used to advantage in a number of high power and broadband applications. In one application, such a tube is used to drive the output transmission line of a transmitter directly without the use of matching networks. In another application, two of such tubes are used to drive the grid and cathode of a traveling wave tube in a radar system.

DESCRIPTION OF THE PREFERRED EMBODIMENT

Figure 1A:
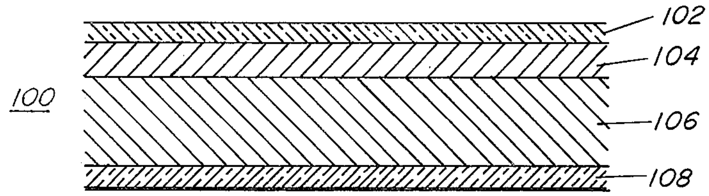
FIGS. 1A through 1F are a series of cross-sectional views of a diode according to the present invention in various stages of fabrication.

With reference now to FIGS. 1A through 1F the fabrication of a diode in accordance with the present invention will now be described. In FIG. 1A is shown a cross-sectional view of a wafer 100 of N-type semiconductor material after the first steps of fabrication have been completed. The slab of N-type semiconductor material is doped in the range of $10^{13}$ to $10^{16}$ $cm^{-3}$ with a material selected from the V-A group of the period table of the elements, such as arsenic or antimony. Wafer 100 is typically between 10 and 20 mils in thickness. The first step in the process is to diffuse in a layer of P-type material 104 to a depth of 2000–3000 A with a doping density of approximately $10^{20}$ $cm^{-3}$. In the preferred embodiment, boron is used as the P dopant. Oxide layers 102 and 108 are then formed on both sides of wafer 100.

Figure 1B:
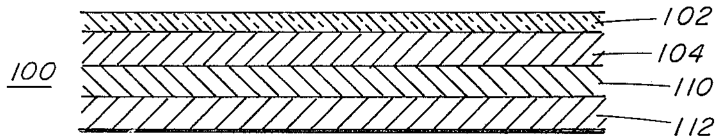

Wafer 100 is then thinned from the lower side to a thickness of 0.5–2 mils, after removing the lower layer of oxide as shown in FIG. 1B. A highly doped N+ layer 112 next is diffused into the lower surface of wafer 100. N+ layer 112 is diffused to such a depth that N region 110 remains with a thickness in the range of 5–40 microns. N+ layer 112 typically has a doping density of 5 $\times 10^{19}$ $cm^{-3}$ with preferably phosphorus as the dopant.

Figure 1C:
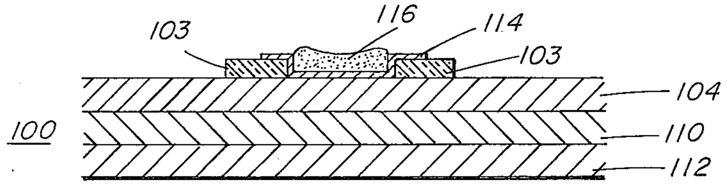

The next step in the process as shown in FIG. 1C is to mask the upper layer of oxide 102 above the apertured oxide layer 103, which is preferably annular shaped, and etch away the undesired oxide. The inner diameter of oxide layer 103 may be of any desired dimension depending upon the total current required. Practical diodes may be fabricated with apertures in the range of 0.5 mils to greater than one centimeter. Next, a thin layer of aluminum 114, typically 1000 A in thickness, is deposited upon the inner portion of oxide layer 103 over the surface of P layer 104 and extending approximately half way across the oxide layer 103. A layer of photoresistive material 116 is then deposited over aluminum layer 114 in that portion within the inside of oxide layer 103.

Figure 1D:
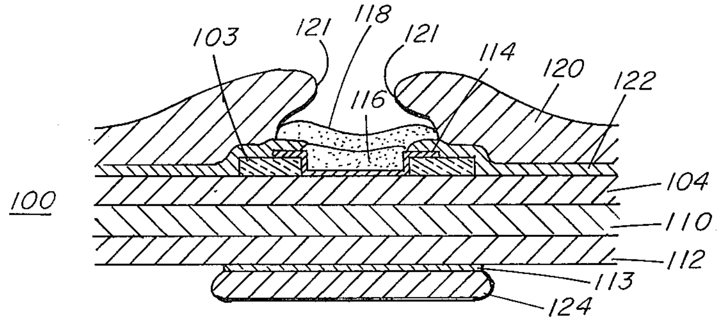

As shown in FIG. 1D, a layer 122 of highly conductive material such as an alloy of chrome and gold or chrome and molybdenum is deposited over the surface of the device making electrical contact with but not covering aluminum layer 114. A second layer of photoresistive material 118 is then deposited over the first layer of photoresistive material 116, and above the inner rim of the highly conductive layer 122. A highly conductive layer 113 is also deposited on the lower surface of wafer 100 to make electrical and thermal contact with N+ region 112. Shielding layer 120 and contact layer 124 are then plated onto the device. In the preferred embodiment, gold is used for layers 120 and 124 although other refractory materials, such as titanium or molybdenum, may be used as well. Edge 121 of shield layer 120 extends slightly beyond the inner edge of oxide layer 103 and aluminum layer 114 thereby providing a shield against electron bombardment for the periphery of the device.

Figure 1E:
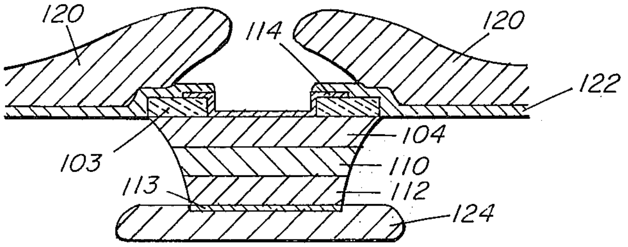
Figure 1F:
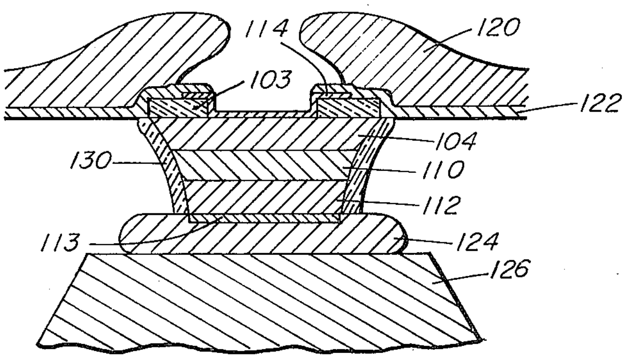

Then, as shown in FIG. 1E, photoresistive material 116 and 118 is stripped away. The wafer is etched from the lower side leaving a mesa structure resting upon contact layer 124. Contact layer 124 may be used as the heat sink for the device or it may be used in conjunction with a larger heat sink. Oxide layer 130 is then deposited on the outer surface of the mesa structure and an optional heat sink 126, which may be of copper, is placed in thermal contact with contact layer 124. When the diode is bombarded from electrons as would, in these diagrams be coming from directly above, any electrons which would not directly strike the exposed surface of the diode within the aperture in the oxide region 103 are absorbed by shielding layer 120. Any surface charge which does accumulate, such as by secondary electrons, is conducted away through the aluminum layer 114 and highly conductive layer 122. It is to be noted that the aluminum layer is sufficiently thin to be porous to high energy incoming electrons but will conduct away low energy surface charged electrons.

Of course, the conductivity types shown are by way of illustration only as diodes may be constructed within the scope of the present invention using other arrangements of conductivity types. For example, the upper layer can be N+ type, the center layer N, and the lower layer P. Or, starting with a P-type wafer, the upper wafer can be N, the center P, and the lower P+. Again, starting with a P-type wafer, the upper can be P+, the center P, and the lower N.

Figure 2:
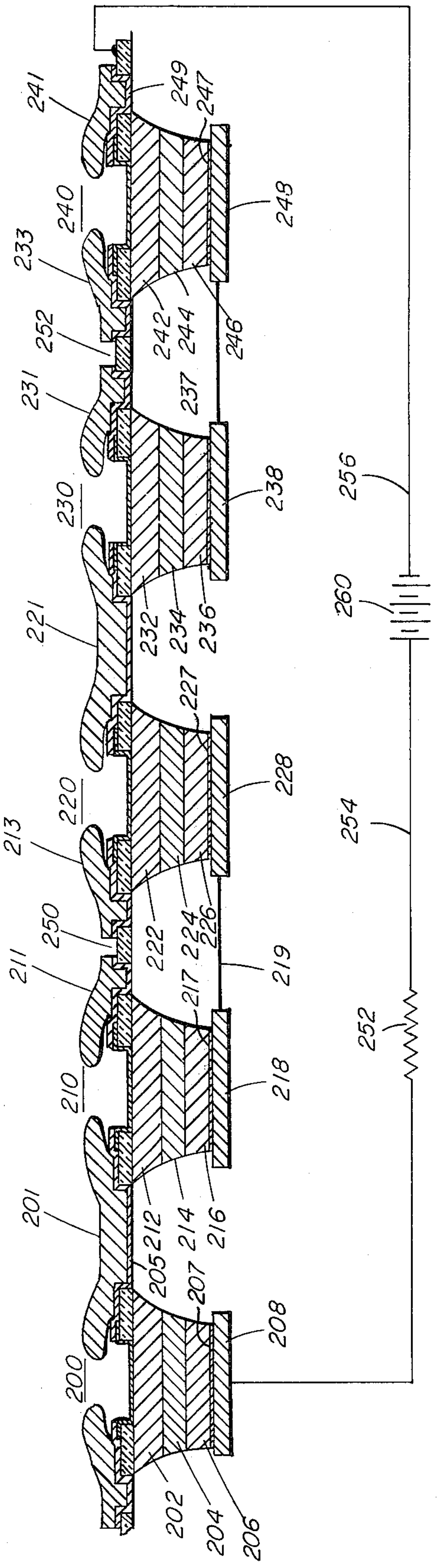
FIG. 2 is a cross-sectional view showing a plurality of the diodes according to the present invention connected in a series arrangement for use in an electron beam semiconductor tube.

In FIG. 2 is shown a cross-sectional view of five of the diodes constructed in accordance with the principles illustrated in the sequence of steps from FIGS. 1A to 1F in which the five diodes are connected in series. With this arrangement of diodes, the total capacitance per total exposed surface area is considerably reduced over a single diode having the same total surface area or the same number of diodes connected in parallel. For example, if all of the diodes shown in FIG. 2 have the same capacitance, the total capacitance will be one-fifth that of any one diode while the current contribution from each diode adds linearly. If the capacitances are other than equal, the rule for computing the total capacitance in a series arrangement will be applicable. In all cases, the total capacitance will be substantially reduced.

In order to series connect the diodes shown in FIG. 2, the conductivity type of the upper and lower semiconductor layers of each diode alternates between adjacent diodes. Layer 202 of diode 200 is P, layer 212 of diode 210 is N+, layer 222 of diode 220 is P, layer 232 of diode 230 is N+ and layer 242 of diode 240 is P. Layers, 204, 214, 224, 234 and 244 are all of the N conductivity type so that all of the diodes may be constructed from a single semiconductor wafer. Dopant types are alternated between diodes. Layer 206 of diode 200 is N+, layer 216 of diode 210 is P+, layer 226 of diode 220 is N+, layer 236 of diode 230 is P+ and layer 246 of diode 240 is N+. Shielding layer 201 and highly conductive layer 205 connect P layer 202 of diode 200 with N layer 212 of diode 210. Connection between P+ layer 216 of diode 210 and N+ layer 226 of diode 220 is made on conductive line 219 through lower highly conductive layers 217 and 227. An insulating dielectric slab 250 is provided between shielding layers 211 and 213 to prevent current flow between N+ region 212 of diode 210 and P region 222 of diode 220. A similar set of connections is made between diodes 220, 230 and 240. Five diodes are shown by way of illustration only as any number of diodes may be used. As shown schematically, battery 260 reverse biases the series combination of diodes. The positive terminal 254 of battery 260 is connected to N+ layer 206 of diode 200 through load resistor 252. The negative terminal 256 of battery 260 is coupled to P layer 242 of diode 240 through shielding layer 241 and highly conductive layer 249.

Figure 3:
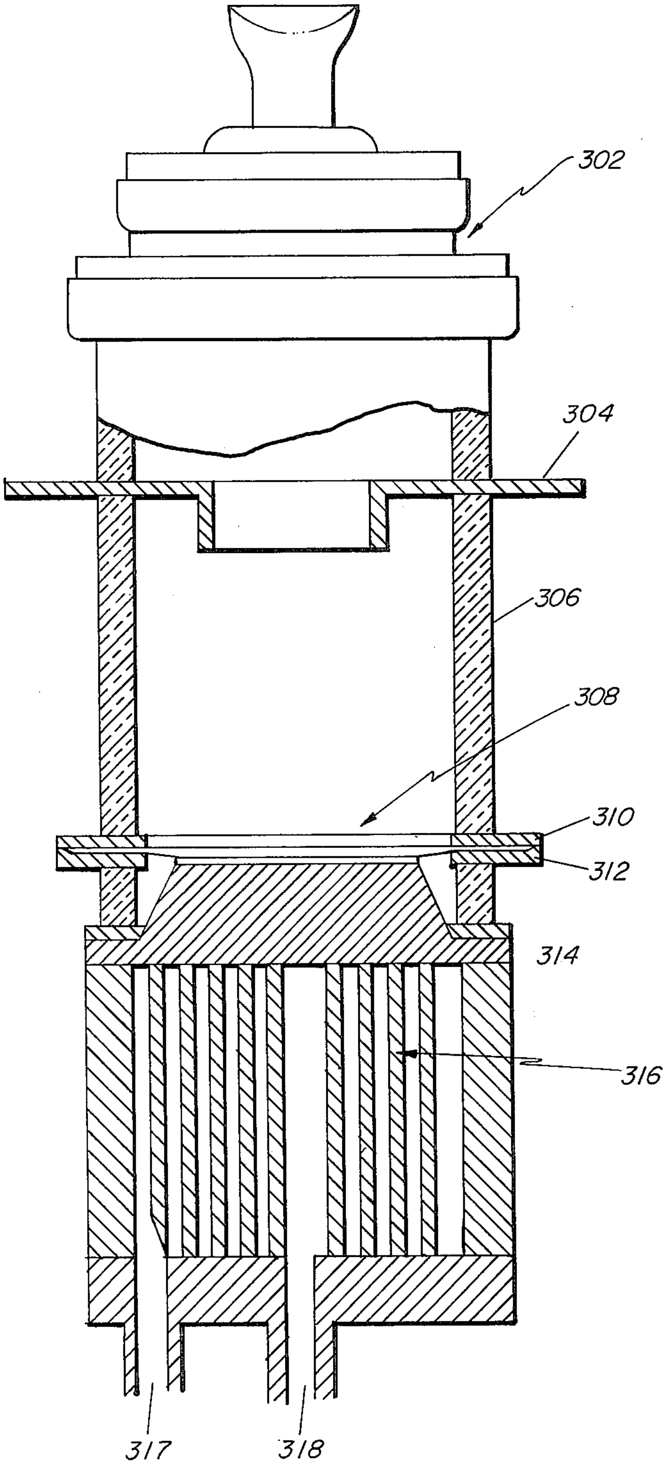
FIG. 3 is a partially cross-sectioned view showing an electron beam semiconductor tube in accordance with the present invention.

In FIG. 3 is shown an electron beam semiconductor tube constructed using a diode fashioned in accordance with the teachings of the present invention. An electron gun 302 with a heated cathode, emits electrons which are accelerated towards diode 308 by an external biasing voltage, which is not shown. Focussing electrode 304, maintained at 200–300 volts DC with respect to the cathode, collimates the electron beam on its way towards diode 308. Glass or ceramic envelope 306 provides support for diode 308, focussing electrode 304, and electron gun 302. The connections to the anode and cathode of the diode 308 are brought out on electrodes 310 and 312. Copper heat sink 314 thermally contacts the underside of diode 308 to carry away generated heat. A water cooling jacket 316, formed in a spiral underlying heat sink 314 and preferably constructed of copper is optionally provided to further conduct away heat and is particularly useful in high power applications where large amounts of heat are generated within diode 308. Water fittings 317 and 318 provide means for water ingress and egress to cooling jacket 316.

Figure 4:
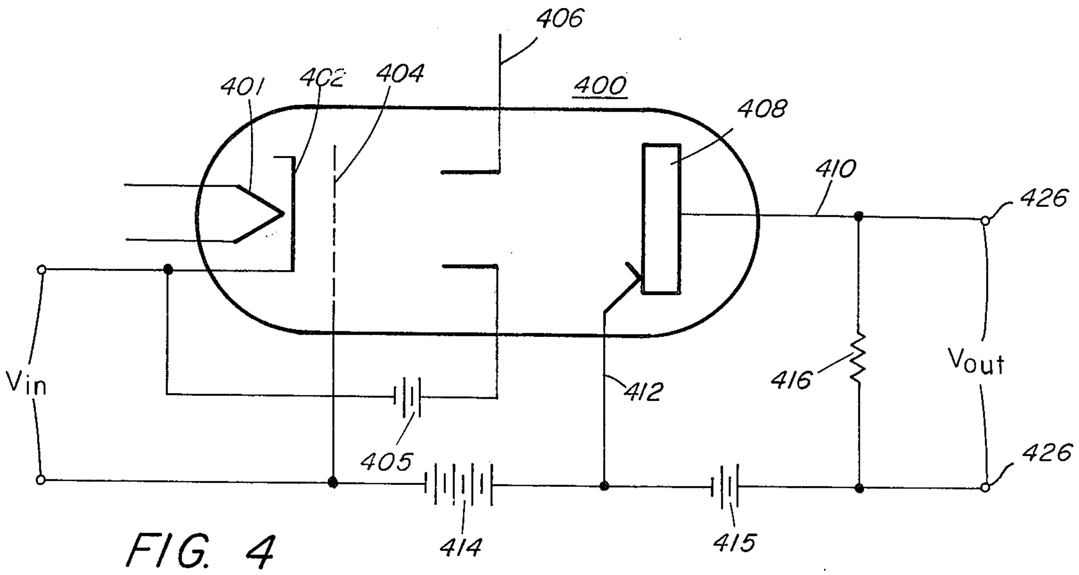
FIG. 4 is a schematic diagram showing the required biasing and operating circuitry required for tubes in accordance with the present invention.

In FIG. 4 is shown the schematic diagram of an electron beam semiconductor tube with biasing and power applied and with a load attached. A voltage source represented by battery 414 is connected between anode connection 412 to diode or diode array 408 and grid or deflection structure 404. In the preferred embodiment, voltage source 414 is operated at 10,000 volts. A second voltage source 405 is coupled between the focus electrode 406 and the cathode of the electron gun 402. Heater 401 is connected to a source of either alternating or direct current, which is not shown. The load resistance 416 is coupled across diode or diode array 408 in series with voltage source 415. Negative terminal of voltage source 415 is coupled to anode lead 412 of diode or diode array 408 thereby providing reverse bias. The voltage of voltage source 415 may range between 200 and 2000 volts. It is to be noted that with the present invention much higher voltages are possible for reverse biasing than were previously possible. In some broadband transmitter circuits, it is possible to drive the output coaxial cable directly from terminals 426 as the output impedance of tubes constructed in accordance with the present invention have output impedances typically near those of output transmission lines, for example, 50 ohms. Since the need for an impedance matching network is thereby obviated, the bandwidth of the resulting transmitter circuit is greatly increased since the frequency characteristics of the matching network are a limiting factor in determining the overall frequency response of the transmitter circuit.

Figure 5:
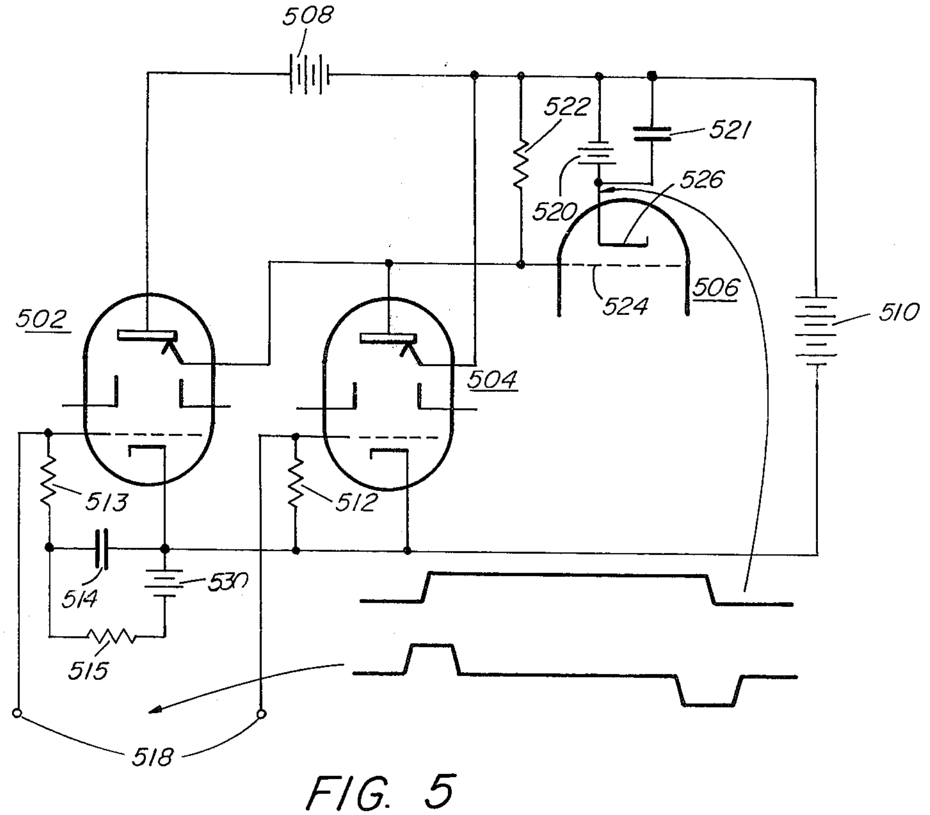
FIG. 5 is a schematic diagram showing two of the tubes constructed in accordance with the present invention used to advantage in driving a traveling wave tube.

In FIG. 5 is shown the schematic diagram of a circuit employing two of the electron beam semiconductor tubes in accordance with the present invention to advantage in driving a traveling wave tube such as in a radar transmitter. In such applications, it is imperative that the traveling wave tube be turned on and off rapidly. To turn on the traveling wave tube, a large current pulse with a rise time on the order of one nanosecond need be applied to the grid. The large turn on and turn off current requirements derive largely from the charging requirements of the capacitance formed by the grid 524 and cathode 526 of traveling wave tube 506. Similarly, to turn off the traveling wave tube, a large pulse of current need be extracted from the same capacitance in a similarly short time.

When traveling wave tube 506 is to be turned on, a positive going pulse is applied between terminals 518. That pulse turns on electron beam semiconductor tube 502 causing current to flow from battery 508 through electron beam semiconductor tube 502 to grid 524 and cathode 526 of traveling wave tube 506. Bias for traveling wave tube 506 is provided by voltage source 520 and grid bias resistor 522. Voltage source 510 provides the beam acceleration voltage for electron beam semiconductor tubes 502 and 504. Also provided but not shown are biasing potentials for the focussing electrodes of electron beam semiconductor tubes 502 and 504 as well as a heater and a voltage source for the heaters in each of these tubes. Voltage source 530, resistors 512, 513, and 515 and capacitor 514 provide grid to cathode bias for electron beam semiconductor tubes 502 and 504.

When the traveling wave tube 506 is to be turned off, a negative going voltage pulse is applied to terminals 518. Electron beam semiconductor tube 504 is then turned on effectively shorting the grid and cathode together thereby extracting the charge stored between the grid and cathode of the traveling wave tube 506 through voltage source 520 and capacitor 521.

Although preferred embodiments of the invention have been described, numerous modifications and variations thereof would be apparent to one skilled in the art without departing from the spirit and scope of the present invention.

What is claimed is:

1. In combination:

means for providing a beam of electrons;

a target comprising a two-dimensional array of semiconductor diodes, each of said diodes having a substantially planar junction, the planes of said junctions being substantially parallel to the plane of said array, said beam of electrons being directed substantially normal to said plane of said array; and conductive shielding means directly connected to each of said diodes for shielding peripheral portions of each of said diodes from said electron beam.

2. The combination of claim 1 wherein said beam of electrons penetrates a surface of each of said diodes.

3. The combination of claim 2 wherein said conductive means is contiguous to said surface of each of said diodes.

4. The combination of claim 3 wherein said conductive means comprises a layer of metal, said layer having one or more apertures.

5. The combination of claim 4 wherein each of said junctions is located under one or more of said apertures.

6. The combination of claim 5 further comprising utilization means in an electron tube.

7. The combination of claim 6 further comprising utilization means in a transmitter.

8. The combination of claim 6 further comprising utilization means for driving a traveling wave tube.

9. In combination:

means for providing a beam of electrons;

a target comprising a two-dimensional array of semiconductor diodes, each of said diodes having a mesa structure comprising a substantially planar P-N junction, the planes of said junctions being substantially parallel to the plane of said array, said beam of electrons being directed substantially normal to said plane of said array;

a first conductive layer covering the surface of said diodes in the direction of said beam providing means, said first layer being substantially transparent to said beam of electrons; and a second conductive layer having apertures therein, said second conductive layer being contiguous to said first conductive layer and covering a portion of said first conductive layer, said second conductive layer being substantially impermeable by said beam of electrons.

10. The combination of claim 9 further comprising means for conveying heat away from said diodes.

11. The combination of claim 10 wherein said beam of electrons strikes a first surface of said diodes and said means for conveying away heat is contiguous to a second surface of said diodes.

12. The combination of claim 11 further comprising utilization means in an electron tube.

13. The combination of claim 9 wherein at least a portion of said diodes are connected in series.

14. The combination of claim 13 wherein all of said diodes are fabricated from one semiconductor wafer.

15. In combination:

means for providing a beam of electrons;

one or more diode junctions within a semiconductor body, said junctions being substantially parallel to a surface of said semiconductor body, said electron beam striking said surface substantially normal to the plane of said junctions, and said diode junctions being arranged in a two-dimensional array, said plane of said junctions being substantially parallel to the plane of said array;

a layer of conductive material covering at least a portion of said surface, said beam of electrons passing through said layer; and conductive shielding means contiguous to said layer, said shielding means preventing said electron beam from striking at least peripheral portions of said surface.

16. The combination of claim 15 wherein said conductive material is an alloy of chrome and gold.

17. The combination of claim 16 wherein said shielding means is gold.

* * * * *